United States Patent
Witte

(10) Patent No.: US 7,978,790 B2
(45) Date of Patent: Jul. 12, 2011

(54) METHOD AND CIRCUIT FOR CARRIER CONTROL IN A QUADRATURE DEMODULATOR

(75) Inventor: Franz-Otto Witte, Teningen (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 974 days.

(21) Appl. No.: 11/787,205

(22) Filed: Apr. 13, 2007

(65) Prior Publication Data

US 2008/0037688 A1   Feb. 14, 2008

(30) Foreign Application Priority Data

Apr. 13, 2006  (DE) .................. 10 2006 017 868

(51) Int. Cl.
*H04L 27/22* (2006.01)
(52) U.S. Cl. ........................ 375/326; 329/307
(58) Field of Classification Search .................. 375/326, 375/327, 344; 329/304, 306, 307; 455/192.1, 455/192.2
See application file for complete search history.

(56) References Cited

U.S. PATENT DOCUMENTS

| | | | |
|---|---|---|---|
| 5,311,546 A | | 5/1994 | Paik et al. |
| 5,544,200 A | * | 8/1996 | An ................ 375/344 |
| 5,774,512 A | | 6/1998 | Bhatt |
| 5,796,786 A | | 8/1998 | Lee |
| 5,905,405 A | | 5/1999 | Ishizawa |
| 6,041,085 A | | 3/2000 | Anzai |
| 6,661,834 B1 | * | 12/2003 | Shan et al. .............. 375/324 |
| 6,940,923 B2 | * | 9/2005 | Ohishi ..................... 375/326 |
| 2001/0017897 A1 | * | 8/2001 | Ahn ........................ 329/304 |
| 2006/0067431 A1 | | 3/2006 | Steinbach |
| 2006/0140308 A1 | | 6/2006 | Shearer, III et al. |

FOREIGN PATENT DOCUMENTS

DE    102004047424 A1    4/2006

OTHER PUBLICATIONS

Brand, S., Philips Semiconductors, PCALE. "QAM Demodulation." (22 Pages). http://wireless.per.nl/reference/pdfandps/qam.pdf.

* cited by examiner

*Primary Examiner* — Betsy L Deppe
(74) *Attorney, Agent, or Firm* — DLA Piper LLP (US)

(57) ABSTRACT

The invention relates to a method and a circuit for carrier control in a quadrature demodulator, wherein a complex-value input signal (I, Q) is supplied to a mixer (1) to perform mixing with a mixing frequency (fm) to create a mixed signal (Ir, Qr), the mixed signal (Ir, Qr) is supplied to a processing section (s) to generate a processed signal (Ie, Qe), the processed signal (Ie, Qe) is supplied to phase measurement device (3) in order to measure a phase ($\phi m$) of the processed signal (Ie, Qe) and the measured phase ($\phi m$) is supplied to a phase controller (4) in order to control the mixing frequency (fm); wherein an idle time ($z^{-d}$) is created at least during the processing in the processing section (2). To enable a fast switching-on transition, the mixing frequency (fm) is summed or integrated to create a mixing phase ($\phi c$), the mixing phase ($\phi c$) is used for the mixing operation, as well as fed back to the phase control (4, 23), and an error created by the feedback is compensated for with a time-delayed second feedback of the mixing phase ($\phi c$).

16 Claims, 2 Drawing Sheets

US 7,978,790 B2

METHOD AND CIRCUIT FOR CARRIER CONTROL IN A QUADRATURE DEMODULATOR

RELATED APPLICATIONS/PRIORITY CLAIMS

This application claims the priority benefits under 35 USC 119 of German Patent Application No. 10 2006 017 868.8 filed on Apr. 13, 2006.

BACKGROUND OF THE INVENTION

1. Field of the Invention

The invention relates to a method and a circuit for carrier control in a quadrature demodulator.

2. Description of Related Art

FIG. 3 shows an example of a circuit arrangement for carrier control in a quadrature demodulator. A complex-value input signal I and Q is provided to a mixer 1 for mixing with a mixing frequency fm to create a mixed signal Ir, Qr. This mixed signal Ir, Qr is input to a processing section 2 with a channel equalizer, whereby a signal delay and a so called idle time $z^{-d}$ is created between one of the processed signals Ie, Qe and the mixed signal Ir, Qr. The processed signal Ie, Qe is applied to a rotator 4, which rotates the input signal and provides it to a circuit for phase measurement, which is designed for the measuring of a phase .phi.m of the processed signal Ie, Qe. A controller 4 determines the mixing frequency fm and inputs the frequency to a mixer 1.

In such arrangements, a general problem occurs in the case of digital demodulators for terrestrial signals, which are usually equipped with a channel equalizer. The group delay time of the channel equalizers creates, together with the impulse shaping filters used for the carrier control and for the timing control, a substantial idle time, which essentially results in a slow control. This creates major problems for adaptation of channel equalizers.

When one looks at this problem, one can infer from the known type of circuit shown in FIG. 3 that the complex-value processed signal Ie, Qe can be further supplied to a rotator 5, which rotates the supplied signal and furnishes it to a discriminator 6 via a phase measurement stage 3.

The discriminator 6 carries out a discriminating process in a known manner and outputs the decision signal to a second controller 7 and to a back rotator 8. In addition, the measured phase φm is input to the second controller 7. The second controller 7 provides a generated signal that is dependent on the signal input to the second controller 7 to the controller 4 as the control variable. The signal of the second controller 7 is also applied as a control variable to the rotator 5 and to the back rotator 8. The controller 4 is adapted to the second controller 7 with a slower time constant. The back rotator 8 determines an error signal es, which is input to the channel equalizer 2. With such an arrangement, a second, faster control circuit is implement with a smaller idle time at the output, which is active only during a slow switching-on transition of the main controller, and which makes it possible to achieve a correct adjustment of the channel equalizer 2 more quickly.

A disadvantage of a solution using an additional, second controller is the additional expense, which consists of two additional rotator blocks and a second controller. Another disadvantage is that the actual carrier/symbol cycle is still slow.

BRIEF SUMMARY OF THE INVENTION

The object of the present invention is therefore to propose a method and a circuit for carrier control in a quadrature demodulator, which enables fast control despite the existing idle time in a processing section.

This object is achieved by the method for carrier control in a quadrature demodulator, and by a circuit for carrier control in a quadrature demodulator.

According to such a method or to a circuit for carrier control which has a corresponding design, deployed in a quadrature demodulator, a complex-value input signal is supplied for mixing with a mixing frequency to create a mixed signal. The mixed signal is supplied to a processing section in order to generate a processed signal. The processed signal is supplied to a phase measurement device in order to measure the phase of the processed signal. The measured phase is supplied to another phase controller in order to control the mixing frequency, whereby an approximating signal delay is created due to an idle time period occurring at least during the processing in the processing section. In this case, the time-delayed measured phase is thus used for the control. In order to take into account this fact and to make it possible to switch the control on faster, the mixing frequency is added up or integrated with a mixing phase, whereby the mixing phase is used for the mixing operation, as well as fed back for a faster correction to the phase control. An error created by this feedback is compensated for with a time-delayed second feedback of the mixing phase.

The second feedback is time-delayed for this purpose by a time period corresponding to the idle time. In practical operations, the actual idle time is, however, often not known, which is why the second feedback is time-delayed by a time period corresponding in particular to a variable on the order of an estimated value representing the idle time period.

The first feedback of the mixing phase is performed in order to control the phase, so that, ideally, it is delayed only by one cycle, or even by several cycles.

The phase control in such a circuit is preferably performed with a simple conversion of a phase signal, which is added and fed back by means of a delay circuit from the measured phase and supplied for the time-delayed second phase. In this case, the added and subtracted phase value is subtracted prior to being supplied for phase control, in particular prior to a desired phase, by means of an adding arrangement, which is designed also for subtracting of negative values.

The integrated mixing phase is preferably mixed with the complex-value input signal in a CORDIC. The result is that the phase rotation of the complex-value input signal is produced in a simple manner, before the signal is input for further processing. No further phase rotation or only limited phase rotation normally occurs in the actual processing section. The use of a CORDIC or a corresponding circuit enables in particular also mixing with a similarly integrated mixing phase, wherein the signal can be additionally fed back for control purposes.

A phase value which was fed-back for phase control purposes is preferably supplied in parallel to a circuit for offset correction in order to determine a remaining error in the actual phase. A corresponding negative error can be added up or subtracted in an integrator which is used for integration of the mixing frequency. This makes it possible to avoid comingling with a phase error of the desired phase.

A rotating integrator, which corresponds approximately to 2π, is preferably used for integration.

Such a procedure and circuit make it possible to provide a compensation for idle time, which speeds up the control characteristics to such an extent so that they preferably corresponds to the control characteristics of a higher order system. This is true in particular about the stabilization of constant interferences which have the same form, which occur with carrier control. The additional expense is limited in this case since it involves only the implementation of a delay line providing a delay, which in an ideal case corresponds to the signal delay. In principle, however, the delay line can also provide a time-delayed feedback for a mixing phase having a delay value that preferably does not deviate too much from idle time of the processing section. Sub-sampling is a potential capability that is also particularly advantageous.

Based on the initial research, a distinctly faster switching-on transition can be achieved with such a procedure or circuit, preferably using only a fraction of the symbol cycles that would be required without such a method. For example, according to first simulated calculations, a switching-on transition lasting approximately 500 cycles can be reduced to about 70 cycles.

An embodiment example will now be explained in more detail based on the enclosed figures.

DETAILED DESCRIPTION OF THE INVENTION

Figure 1:
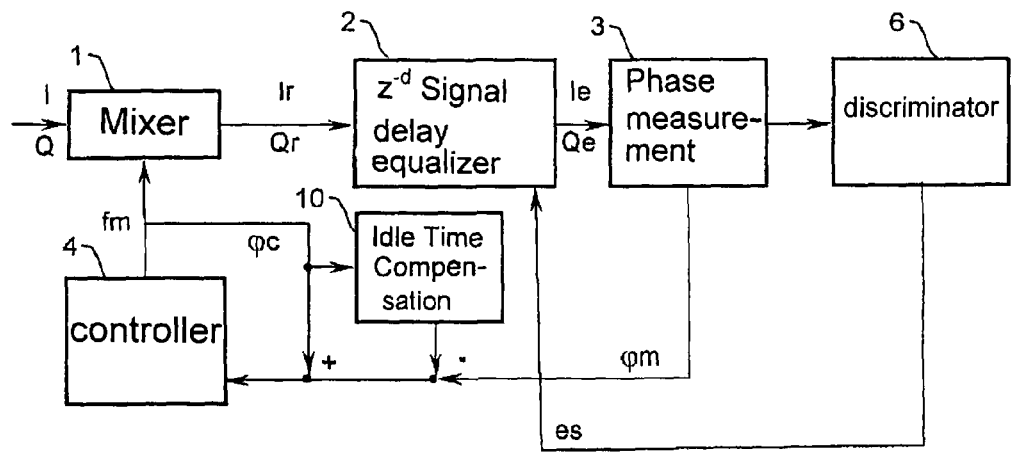
FIG. 1 is a schematic representation of the components of a circuit for carrier control in a quadrature demodulator.

As one can see from the schematic representation shown in FIG. 1, not only does the controller 4 provide a mixing frequency fm to the mixer 1, but also the mixing frequency, or a mixing phase .phi.c obtained from this mixing frequency, to an input of the controller 4 that controls the mixing frequency.

The feedback of the mixing phase φc occurs in this case within the framework of a first feedback, ideally without a time delay, or, realistically, with as small a time delay as possible, preferably with only one cycle. In addition, the mixing phase φc is supplied by means of a time-delayed second feedback to the controller 4 as a value to be additionally subtracted. This time-delayed second feedback, which is generated via a delay switch 10, is used for idle time compensation. The time delay of the time-delayed second feedback ideally corresponds to the idle time $z^{-d}$ of the processing section 2, or in other words the duration of the processing time period in the channel equalizer, or an attempt is made to come as close to this time period as possible.

Figure 3:
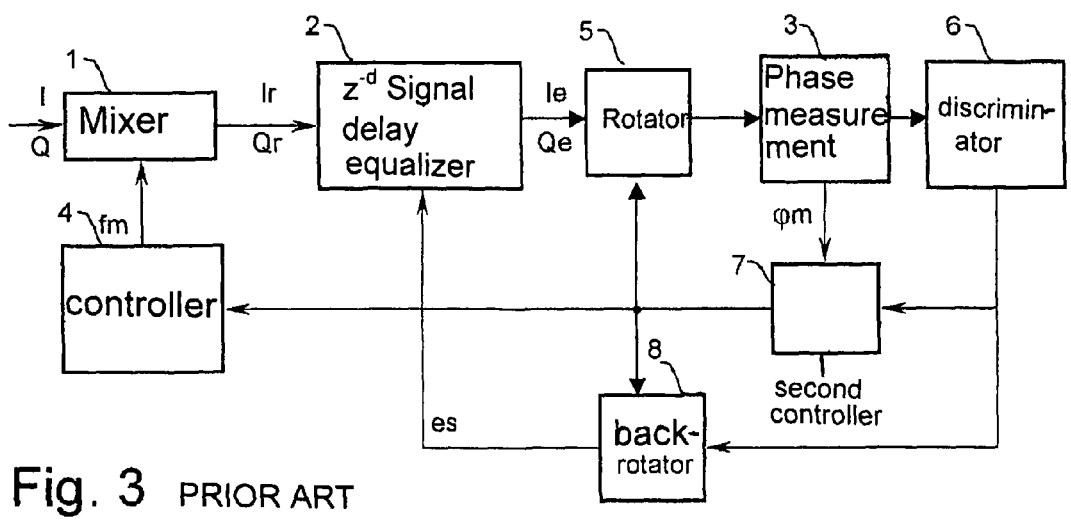
FIG. 3 a circuit for idle-time compensation for carrier and symbol cycle controls in a digital quadrature demodulator according to prior art.

In contrast to the solution according to FIG. 3, this arrangement provides a double feedback of the mixing phase φc, once directly, and once delayed by the idle time $z^{-d}$, to the controller 4, and in particular to a controller 4 having the form of a phase control circuit. This makes it possible, on the one hand, to do without a second controller 7 equipped with additional rotators 5, 8 as shown in FIG. 3, and in addition, to achieve a significantly faster switching-on transition of the controller 4.

Figure 2:
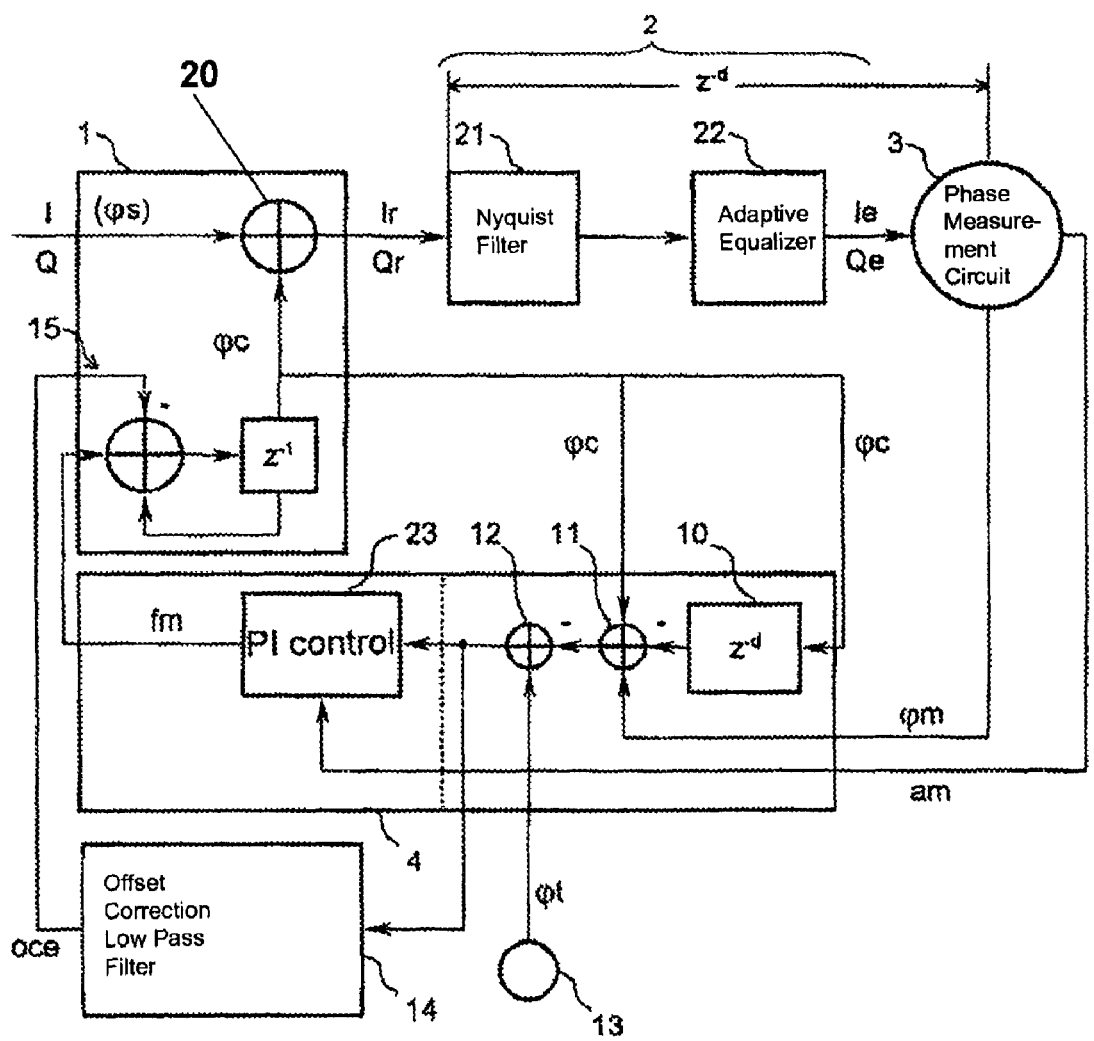
FIG. 2 is a detailed illustration of an embodiment including components required for the comprehension of the method.

FIG. 2 shows the components of such a circuit in more details. In particular, unlike in FIG. 1, an integrator 15 is inserted as shown in FIG. 2 between the controller 4 and the actual mixing components in the mixer 1, which converts the mixing frequency fm into the mixing phase φc. Components and variables that have the same function and/or operate in the same manner are indicated with the same reference symbols, and this convention is maintained also with respect to the embodiments shown in the drawings.

A complex-value input signal I, Q, which is based on a signal phase φs, is again input to the mixer 1. This input signal I, Q is input to a CORDIC, which is represented in the figure by an adder 20. The CORDIC carries out a coordinate rotation of the input complex-value input signal on the basis of the additional mixing phase φc applied at the CORDIC. Therefore, a corresponding rotated, complex mixed signal Ir, Qr is output from the mixer 1, which can be mathematically described according to $Ir+jQr=(I+jQ)e^{j\Phi}$.

This mixed signal Ir, Qr is supplied to the processing section 2, which is constructed for example to include a circuit which filters out inter-symbol frequencies with a Nyquist filter 21. Its output result is then input, for example, to an equalizer 22, which removes signal delays. The resulting output of the equalizer 22 represents the end of the actual processing section 2. Accordingly, the equalizer 22 outputs a complex-value processed signal Ie, Qe, which is input to a phase measurement circuit 3. The phase measurement circuit 3 can be constructed for example as a CORDIC.

The section from the output of the mixer 1 up to and including the phase measurement circuit 3 performs a time delay, which corresponds to the delay time $z^{-d}$ with a time-delay of d cycles.

The phase measurement circuit 3 carries out a conversion of Cartesian coordinates to polar coordinates and outputs a phase value as one measured phase φm, as well as an amplitude value am for the processed complex-value signal Ie, Qe. These output values can, as shown in FIG. 1, be supplied for example to a discriminator for further processing.

The values output from the phase measurement circuit 3 are input to a controller 4 for phase control, using a phase control circuit 23 for carrier and symbol cycle control in a quadrature demodulator. In addition, a desired phase .phi.t of a phase or cycle source 13 is provided to a phase input of the phase control circuit 23. The measured phase .phi.m is subtracted from the desired phase (pt prior to being supplied to the phase control circuit in an adder or subtractor 12. Before this or in addition to this, the actual mixing phase .phi.c is added to the measured phase .phi.m in the same adder or in another adder, in particular an adder 11 which is connected in series, and the mixing phase is input in parallel to the CORDIC 20 in the mixer 1. This mixing phase .phi.c is thus fed back directly to the input of the phase control circuit 23. The term direct feedback should be understood here to mean in particular a feedback that is delayed by one cycle, whereby, as long as it is technically required, several more delay cycles can be also provided.

The mixing phase φc is in addition within the framework of a time-delayed second feedback also supplied to a processing section, which is used as an idle time compensation circuit 10. The processing section 2 performs a delay of sequentially input values of the mixing phase φc by a number of cycles corresponding to the total processing section or to idle time $z^{-d}$ of the processing section 2. A deviation from this value can be tolerated by the circuit, and it ideally leads only to a somewhat delayed switching-on transition. A deviation from the delay time $z^{-d}$ is in particular caused by the fact that the $z^{-d}$ delay time can be varied by the adaptive equalizer 22, and the idle time $z^{-d}$ simplifies the operation of the control section on a model basis. However, the output value d of the time-delayed second mixing phase φc, delayed each time, is subtracted from the phase, in particular, in the second adder 11, and input to the phase control circuit 23. The result is that a mixing phase value, which was initially integrated to achieve a fast switching-on transition, is after the idle time $z^{-d}$ again subtracted.

In other words, the mixing phase φc is fed back to the input of the phase controller or to the phase regulator circuit 23 and the control is thus short-circuited using an estimated value, that is to say with a value that is actually false. In addition, the mixing phase value is delayed by the idle time $z^{-d}$ in order to subtract again the value present in the control, which is actually false, when the value of the real measured phase φm is obtained at the input of the control circuit, i.e., at the input of the phase control circuit 23.

The mixed frequency fm is output from the output of the phase control circuit 23 and input to an integrator 15. The integrator 15 comprises preferably an adder and a register unit of a delay unit $z^{-1}$, which are connected in a loop. The value of the delay unit $z^{-1}$ is thus input for each cycle to an additional input of the adder, as well as providing the mixing phase φc. The integrator 15 samples the added sum in the delay unit $z^{-1}$. The integrator 15 is in this case a dual, complementary rotating integrator, whose values are allocated to phase angles as a mixing phase φc, which are rotated with 2π.

The mixing phase φc is output from the integrator 15 or from its delay unit $z^{-1}$ to the mixer 1, which is preferably constructed as a CORDIC. In this case, the CORDIC shifts the complex-value signal I, Q by the value of the mixing phase φc and outputs the shifted value again, whereby mixing with the mixing frequency is effectively carried out.

Such a circuit would be ideal for correction with the exact knowledge of the real number d of the cycles of the idle time $z^{-d}$. In reality, however, the delay value is only an estimated number d of the cycles, which is not necessarily coincidental with the real number of the cycles of a delay in the processing section 2.

This becomes problematic when a discriminator is deployed in the circuit arrangement, which requires an exact zero phase. In order to correct a zero phase error, the phase value is read at the input of the phase control circuit and supplied to an offset correction circuit 14, in particular an offset correction low pass filter. An error value oce, determined by this offset correction circuit 14, is then subtracted in the integrator 15 from the desired integrated value.

Such a procedure takes into account the fact that real idle time often does not correspond to the compensation time, so that a correct and applicable value will not be obtained after the subtraction of the second delayed mixing phase φc. The consequence of this is that the delayed mixing phase φc is as a rule subtracted either too early or too late. This causes the integrator 15 to integrate a negative error, which leads to a remaining error in the actual phase. This error value is measured by the offset correction circuit 14 and again subtracted in the integrator 15. This counters the effect of the residual phase deviation in the control circuit, so that an ideal zero phase is preferably furnished to the discriminator which is deployed in the circuit arrangement.

The invention claimed is:

1. A method for carrier control in a quadrature demodulator, comprising:
   providing a complex-value input signal to a mixer for mixing with a mixing phase to create a mixed signal,
   providing the mixed signal to a processing section to generate a processed signal, wherein a signal delay is created at least during processing in the processing section due to an idle time,
   measuring a phase of the processed signal using a phase measurement device to generate a measured phase of the processed signal,
   controlling a mixing frequency in a phase controller using the measured phase, integrating or adding the mixing frequency in the phase controller to generate the mixing phase, wherein the mixing phase is fed back to the phase controller, and wherein the mixing phase is provided to a time-delayed second feedback circuit that compensates for a feedback error.

2. The method according claim 1, wherein the time-delayed second feedback has a time delay having the same order of magnitude as the idle time.

3. The method according to claim 1, wherein the time-delayed second feedback has a time delay of at least one symbol cycle.

4. The method according to claim 3, further comprising providing a summed phase signal obtained from the measured phase, the fed-back mixing phase and the time-delayed second fed back mixing phase.

5. The method according to claim 4, further comprising subtracting the summed phase signal from a desired phase prior to being supplied to a control element in the phase controller.

6. The method according to claim 5, wherein the summed phase signal supplied to the control element is supplied in parallel to an offset correction for the determination of the remaining error between the phase of the processed signal and the measured phase of the processed signal.

7. The method according to claim 1, wherein the mixing phase is mixed with the complex-value input signal in a CORDIC.

8. The method according to claim 1, further comprising integrating the mixing frequency using a rotating integrator.

9. A circuit for carrier control in a quadrature demodulator, comprising:
   a mixer configured to mix a complex-value input signal based on a mixing frequency to create a mixed signal,
   a processing section configured to process the mixed signal to create a processed signal, wherein a delay time is created at least due to the processing in the processing section,
   a phase measurement device configured to process the processed signal to generate a measured phase, and
   a phase controller configured to control the mixing frequency based on the measured phase,
   a circuit unit configured to sum or integrate the mixing frequency to create a mixing phase, wherein the mixing phase is further provided to a time-delayed second feedback circuit that compensates for a feedback error.

10. The circuit according to claim 9 wherein the phase controller comprises the time-delayed second feedback circuit and the time-delayed second feedback circuit delays the mixing phase by a time period having the same order of magnitude as the delay time.

11. The circuit according to claim 9, wherein the phase controller comprises at least one adder operably coupled to add the measured phase and the time-delayed mixing phase to generate summed phase value.

12. The circuit according to claim 11, wherein the phase controller further comprises an adder configured to subtract the summed phase value from a desired phase and further configured to provide the subtracted phase value to a control element of the phase controller.

13. The circuit according to claim 12, further comprising
   a circuit for offset correction configured to receive the subtracted phase value for the determination of an error remaining between the measured phase and an actual phase of the processed signal,
   wherein the circuit unit is used for the integration of the mixing frequency and to add a corresponding negative error to the mixing frequency.

14. The circuit according to claim 9, wherein the mixer comprises a CORDIC configured to perform mixing of the complex-value input signal with the mixing phase.

15. The circuit according to claim 9, wherein the circuit unit further comprises an integrator configured to integrate the mixing frequency.

16. The circuit according to claim 15, wherein the integrator is configured as a rotating integrator.

* * * * *